(12) United States Patent
Basker et al.

(10) Patent No.: US 9,502,313 B1
(45) Date of Patent: *Nov. 22, 2016

(54) POLYSILICON RESISTOR FORMATION IN SILICON-ON-INSULATOR REPLACEMENT METAL GATE FINFET PROCESSES

(71) Applicant: International Business Machines Corporation, Armonk, NY (US)

(72) Inventors: Veeraraghavan S. Basker, Schenectady, NY (US); Huiming Bu, Millwood, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/060,008

(22) Filed: Mar. 3, 2016

Related U.S. Application Data

(63) Continuation of application No. 14/708,564, filed on May 11, 2015.

(51) Int. Cl.
*H01L 21/308* (2006.01)
*H01L 21/84* (2006.01)
*H01L 29/66* (2006.01)
(Continued)

(52) U.S. Cl.
CPC ....... *H01L 21/845* (2013.01); *H01L 21/02532* (2013.01); *H01L 21/02595* (2013.01); *H01L 21/26513* (2013.01); *H01L 21/308* (2013.01);
(Continued)

(58) Field of Classification Search
CPC .............. H01L 29/66795; H01L 29/7843; H01L 29/785; H01L 29/0847; H01L 29/66553; H01L 21/845; H01L 21/26513; H01L 21/308; H01L 21/02532
USPC ....................................................... 257/350
See application file for complete search history.

(56) References Cited

U.S. PATENT DOCUMENTS 8,334,572 B2    12/2012   Chung et al.
8,889,508 B2    11/2014   Yeh et al.
(Continued)

OTHER PUBLICATIONS

U.S. Appl. No. 14/708,564, filed May 11, 2015; Entitled: Polysilicon Resistor Formation in Silicon-on-Insulator Replacement Metal Gate FINFET Processes.
(Continued)

*Primary Examiner* — Nathan W Ha
(74) *Attorney, Agent, or Firm* — Cantor Colburn LLP; Vazken Alexanian

(57) ABSTRACT

A method of forming a polysilicon resistor in replacement metal gate (RMG) processing of finFET devices includes forming a plurality of semiconductor fins over a buried oxide layer of a silicon-on-insulator substrate; forming a trench in the buried oxide layer; forming a polysilicon layer over the semiconductor fins and in the trench, the polysilicon layer having a depression corresponding to a location of the trench; forming an insulating layer over the polysilicon layer, and performing a planarizing operation to remove the insulating layer except for a portion of the insulating layer formed in the depression, thereby defining a protective island; patterning the polysilicon layer to define both a dummy gate structure over the fins and the polysilicon resistor; and etching the polysilicon layer to remove the dummy gate structure, wherein the protective island prevents the polysilicon resistor from being removed.

1 Claim, 14 Drawing Sheets

(51) Int. Cl.
  *H01L 49/02* (2006.01)
  *H01L 21/265* (2006.01)
  *H01L 21/02* (2006.01)
(52) U.S. Cl.
  CPC ......... *H01L 28/20* (2013.01); *H01L 29/66545* (2013.01)

(56) References Cited

U.S. PATENT DOCUMENTS

| | | | | | |
|---|---|---|---|---|---|
| 2007/0235785 | A1* | 10/2007 | Kahng | .............. | H01L 29/42384 257/297 |
| 2010/0270619 | A1* | 10/2010 | Lee | ..................... | H01L 29/4908 257/365 |
| 2011/0068414 | A1* | 3/2011 | Anderson | ......... | H01L 29/66795 257/401 |
| 2013/0256748 | A1* | 10/2013 | Clark, Jr. | ........ | H01L 21/823821 257/173 |
| 2014/0264487 | A1* | 9/2014 | Pham | ..................... | H01L 29/78 257/288 |
| 2014/0284723 | A1* | 9/2014 | Lee | ................... | H01L 29/66795 257/369 |
| 2015/0044827 | A1* | 2/2015 | Morin | ................. | H01L 21/0217 438/157 |

OTHER PUBLICATIONS

U.S. Appl. No. 15/157,993, filed May 18, 2016; Entitled: Polysilicon Resistor Formation in Silicon-on-Insulator Replacement Metal Gate FINFET Processes.

List of IBM Patents or Patent Applications Treated as Related; (Appendix P), Date Filed Jul. 20, 2016, 2 pages.

* cited by examiner

POLYSILICON RESISTOR FORMATION IN SILICON-ON-INSULATOR REPLACEMENT METAL GATE FINFET PROCESSES

PRIORITY

This application is a continuation of and claims priority from U.S. patent application Ser. No. 14/708,564, filed on May 11, 2015, entitled "POLYSILICON RESISTOR FORMATION IN SILICON-ON-INSULATOR REPLACEMENT METAL GATE FINFET PROCESSES," the entire contents of which are incorporated herein by reference.

BACKGROUND

The present invention relates generally to semiconductor device manufacturing and, more particularly, to polysilicon resistor formation in silicon-on-insulator (SOI), replacement metal gate (RMG) finFET processes.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

The escalating demands for high density and performance associated with ultra large scale integrated (VLSI) circuit devices have required certain design features, such as shrinking gate lengths, high reliability and increased manufacturing throughput. The continued reduction of design features has challenged the limitations of conventional fabrication techniques.

For example, when the gate length of conventional planar metal oxide semiconductor field effect transistors (MOSFETs) is scaled below 100 nm, problems associated with short channel effects (e.g., excessive leakage between the source and drain regions) become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent one type of structure that has been considered as a candidate for succeeding existing planar MOSFETs. In double-gate MOSFETs, two gates may be used to control short channel effects. A finFET is a double-gate structure that exhibits good short channel behavior, and includes a channel formed in a vertical fin. The finFET structure may be fabricated using layout and process techniques similar to those used for conventional planar MOSFETs.

SUMMARY

In one aspect, a method of forming a polysilicon resistor in replacement metal gate (RMG) processing of finFET devices includes forming a plurality of semiconductor fins over a buried oxide layer of a silicon-on-insulator substrate; forming a trench in the buried oxide layer; forming a polysilicon layer over the semiconductor fins and in the trench, the polysilicon layer having a depression corresponding to a location of the trench; forming an insulating layer over the polysilicon layer, and performing a planarizing operation to remove the insulating layer except for a portion of the insulating layer formed in the depression, thereby defining a protective island; patterning the polysilicon layer to define both a dummy gate structure over the fins and the polysilicon resistor; and etching the polysilicon layer to remove the dummy gate structure, wherein the protective island prevents the polysilicon resistor from being removed.

In another aspect, a method of forming a polysilicon resistor in replacement metal gate (RMG) processing of finFET devices includes forming a plurality of semiconductor fins over a buried oxide layer of a silicon-on-insulator substrate; forming a trench in the buried oxide layer; forming conformal oxide layer on the semiconductor fins, the buried oxide layer, and the trench; forming a polysilicon layer over the semiconductor fins and in the trench, the polysilicon layer having a depression corresponding to a location of the trench; forming an oxide layer over the polysilicon layer; planarizing the oxide layer and the polysilicon layer so as to remove the oxide layer, except for a portion of the oxide layer formed in the depression, thereby defining a protective oxide island directly over a portion of the polysilicon layer corresponding to a location of the polysilicon resistor; forming a nitride hardmask over the polysilicon layer and the protective oxide island; patterning the hardmask and etching the polysilicon layer to define both a dummy gate structure over the fins and the polysilicon resistor; doping the polysilicon resistor; depositing a high density plasma (HDP) oxide layer and planarizing the HDP layer to expose the patterned hardmask layer; removing the patterned hardmask layer and etching the exposed polysilicon layer to remove the dummy gate structure, wherein the protective oxide island prevents the polysilicon resistor from being removed; and forming one or more replacement metal gate stack layers over the fins.

In another aspect, a semiconductor device includes a silicon-on-insulator substrate including a bulk layer, a buried oxide layer on the bulk layer, and a plurality of semiconductor fins formed on the buried oxide layer; a polysilicon resistor disposed in a trench formed within the buried oxide layer; and one or more replacement metal gate layers formed over the semiconductor fins.

BRIEF DESCRIPTION OF THE DRAWINGS

Referring to the exemplary drawings wherein like elements are numbered alike in the several Figures:

FIGS. 1 through 14 are a series of cross sectional views of a method of forming resistor devices, in accordance with an exemplary embodiment, in which:

FIG. 1 illustrates a starting SOI substrate;

FIG. 2 illustrates the formation of one or more semiconductor fins in the SOI layer of the SOI substrate;

FIG. 3 illustrates a photoresist pattern formed over the structure of FIG. 2;

FIG. 4 illustrates an etch process to form a recess within the BOX layer of the SOI substrate;

FIG. 5 illustrates the formation of a conformal oxide layer followed by a polysilicon layer deposition;

FIG. 6 illustrates a blanket oxide deposition over the polysilicon layer;

FIG. 7 illustrates a planarizing operation to remove most of the oxide material, leaving an oxide island directly over the recess in the BOX layer;

FIG. 8 illustrates a hardmask layer formed over the structure of FIG. 7;

FIG. 9 illustrates patterning of the hardmask layer and etching to define both a dummy gate region and a polysilicon resistor;

FIG. 10 illustrates doping of the polysilicon resistor;

FIG. 11 illustrates forming a high density plasma (HDP) oxide layer followed by planarizing to expose remaining portions of the hardmask layer;

FIG. 12 illustrates removal of the hardmask layer and the dummy polysilicon gate material;

FIG. 13 illustrates the formation of high-k, workfunction and gate metal layers on the structure of FIG. 12; and FIG. 14 illustrates planarizing the gate stack layers.

DETAILED DESCRIPTION

Polysilicon resistors have been widely used in conventional integrated circuit design, including for resistor capacitor (RC) oscillators, current limitation resistance, electrostatic discharge (ESD) protection, radio frequency (RF) post drivers, on-chip termination, impedance matching, etc. In traditional or gate first fabrication techniques for finFET devices that include a polysilicon resistor or other such passive structures, the polysilicon formation is used for both the gate stack as well as for the resistor.

On the other hand, with replacement metal gate (RMG) or gate last technology for finFET devices, a material such as polysilicon is used to define a dummy gate structure over the semiconductor fins prior to source/drain definition, doping, epitaxial fin merging, etc. Thereafter, the dummy gate material is selectively removed from the structure followed by formation of the final device gate stack materials, such as one or more high-k dielectric layers, metal workfunction layers and metal gate conductor layers. Thus, polysilicon resistors are not easily integrated into RMG finFET processing due to the subsequent removal operation of dummy polysilicon gate material.

Presently, metal resistors are commonly used in RMG finFET processing in lieu of polysilicon resistors. However, the use of metal for the resistor is not as advantageous as polysilicon, since in order to have a larger range of resistance values it is generally necessary to have a wider variety of sizes for the metal resistor given a fairly constant resistivity value. In contrast, polysilicon resistors offer flexibility in terms of resistance variation for a given size, using appropriate adjustments in doping of the resistor, to achieve resistance values of about 200-1000 ohms per square ($\Omega/\square$) for example. Therefore, it would be desirable to be able to integrate polysilicon resistor formation into SOI RMG finFET processing.

Accordingly, disclosed herein is a method of forming polysilicon resistors in SOI, RMG finFET processes. By forming a recess in the buried oxide (BOX) layer of the SOI substrate corresponding to the desired location of a polysilicon resistor, a subsequent polysilicon layer deposition (for both dummy gate and resistor use) will assume a similar topography such that a protective oxide layer may be formed in a corresponding recess above the resistor polysilicon. This protective oxide layer remains as an "oxide island" after a planarizing operation, and will protect the polysilicon resistor during removal of the dummy gate polysilicon material over the fin structures.

Figure 1:
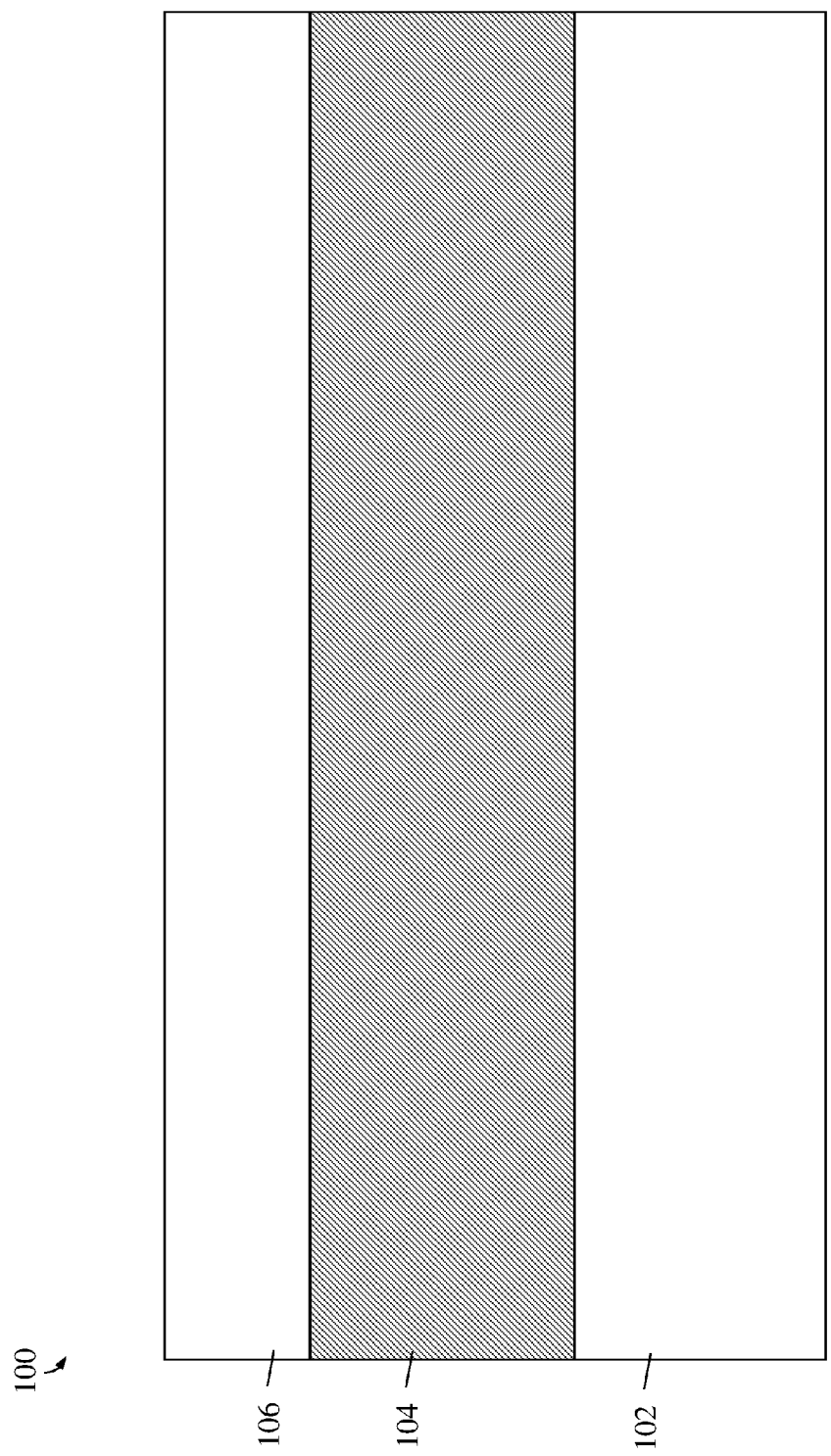
Figure 2:
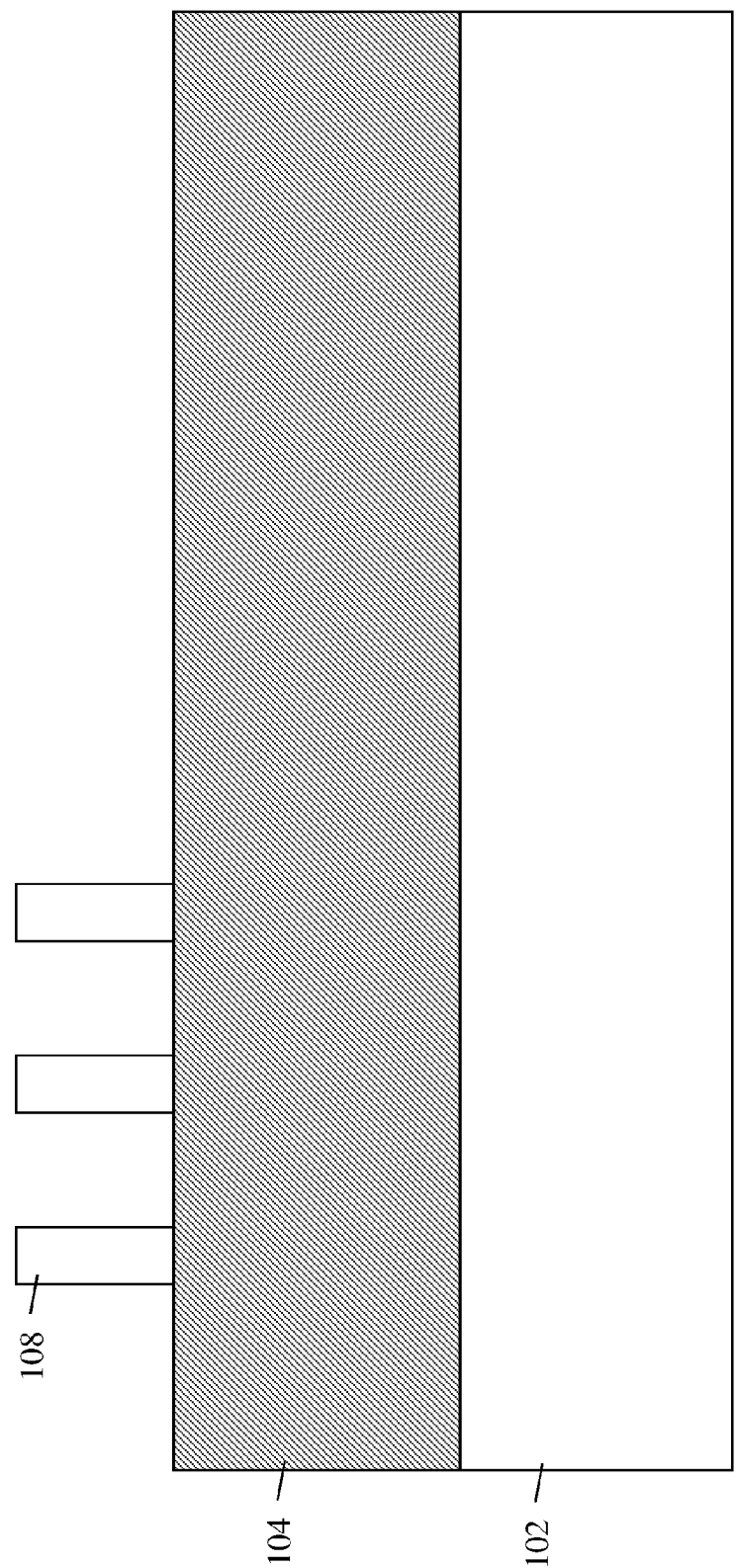

Referring initially to FIG. 1, there is shown a cross sectional view of a starting silicon-on-insulator (SOI) substrate 100 suitable for use in accordance with exemplary embodiments. The SOI substrate 100 includes a bulk semiconductor layer 102 (e.g., silicon), a buried insulator or oxide layer (BOX) 104 formed on the bulk semiconductor layer 102, and a semiconductor (e.g., silicon) layer 106 formed on the BOX layer 104. As shown in FIG. 2, one or more semiconductor fins 108 are formed in the SOI layer 106 using any technique suitable in the art, including photoresist/hardmask patterning and etching, sidewall image transfer (SIT), and the like.

Figure 3:
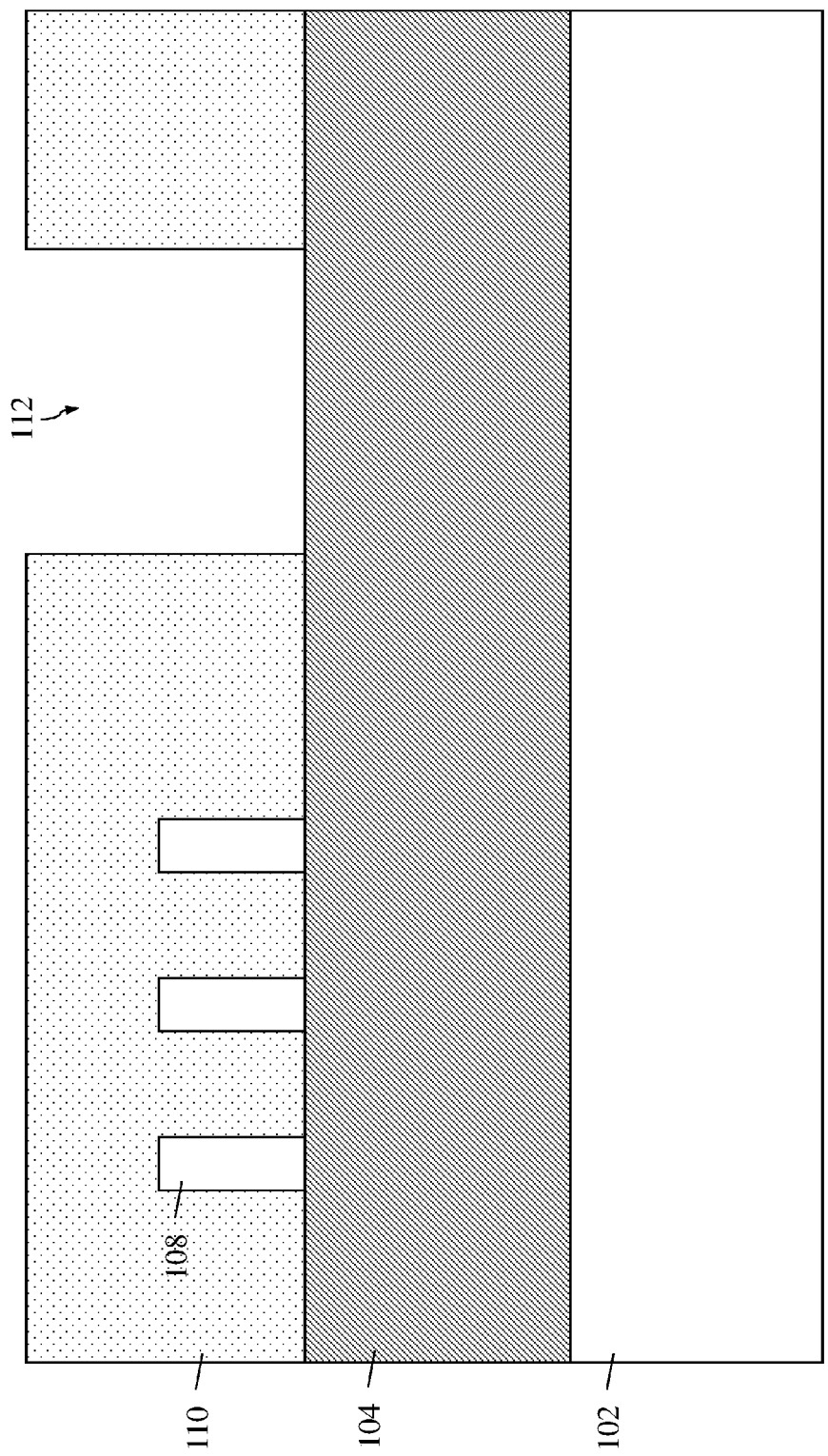
Figure 4:
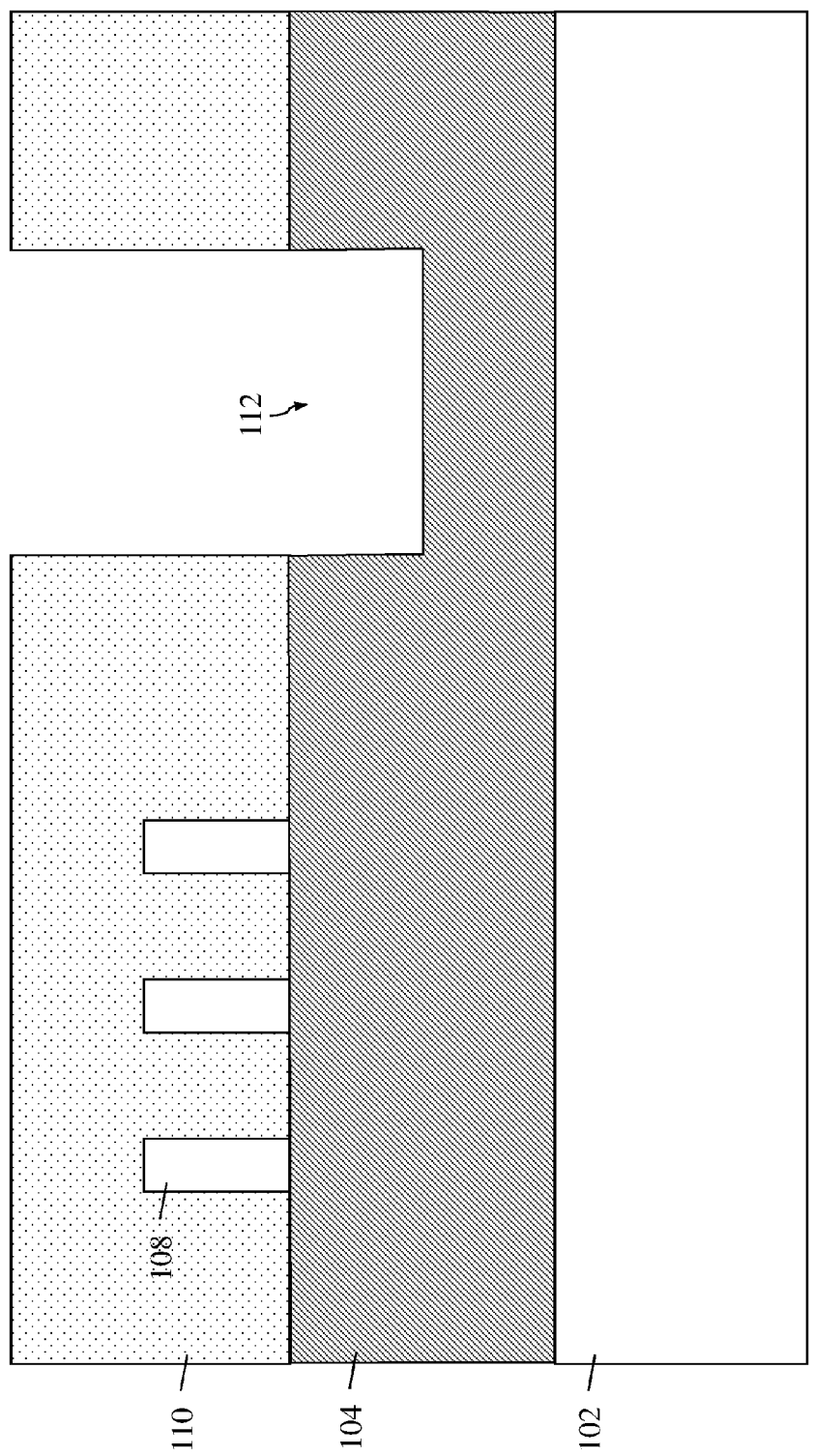

In FIG. 3, a photoresist layer 110 is formed over the structure of FIG. 2, and an opening or trench 112 is patterned into the photoresist layer 110 corresponding to a desired location of a polysilicon resistor to be formed in later processing operations. The trench 112 is then transferred into a portion of the BOX layer 104, as shown in FIG. 4. Once the trench 112 is formed in the BOX layer 104, the photoresist layer may then be removed.

Figure 5:
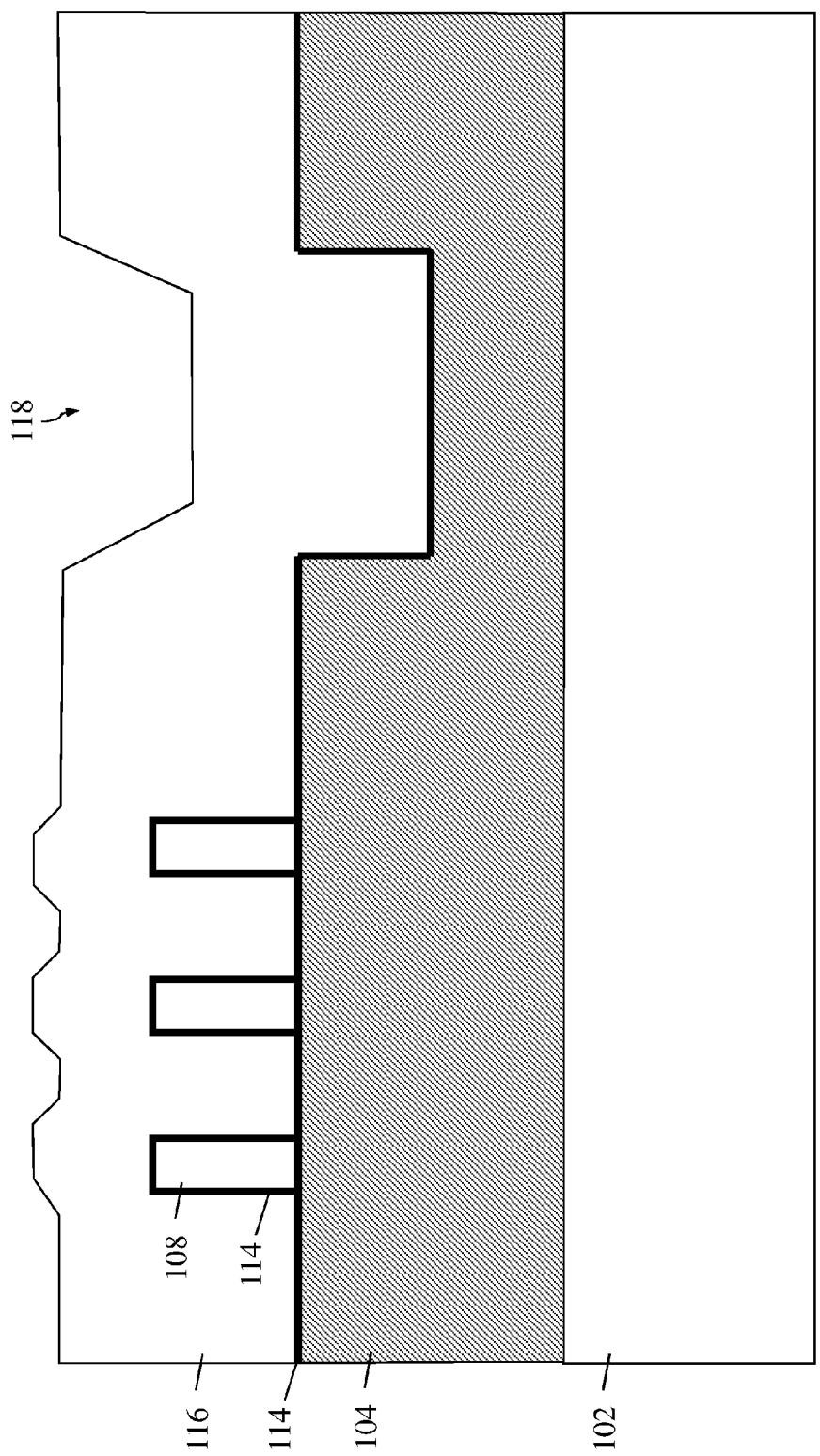

Referring now to FIG. 5, a thin oxide layer (e.g., $SiO_2$) 114 is conformally deposited over exposed surfaces, including the top surface of the BOX layer 104, including side and bottom surfaces of the trench 112, and top and side surfaces of the semiconductor fins 108. The oxide layer 114 may be formed by atomic layer deposition (ALD), for example, to an exemplary thickness of about 2-4 nanometers (nm). The oxide deposition is then followed by deposition of a polysilicon layer 116, which serves as both a dummy gate material over the fins 108, as well as the subsequently defined polysilicon resistor. The oxide layer 114 has an exemplary thickness of about 30-100 nm, and it will be noted that the oxide layer 114 has a topography that generally mirrors that of the underling surfaces. In particular, it will also be seen from FIG. 5 that there is a depression 118 in the oxide layer 114 corresponding to the trench 112 defined in the BOX layer 104.

Figure 6:
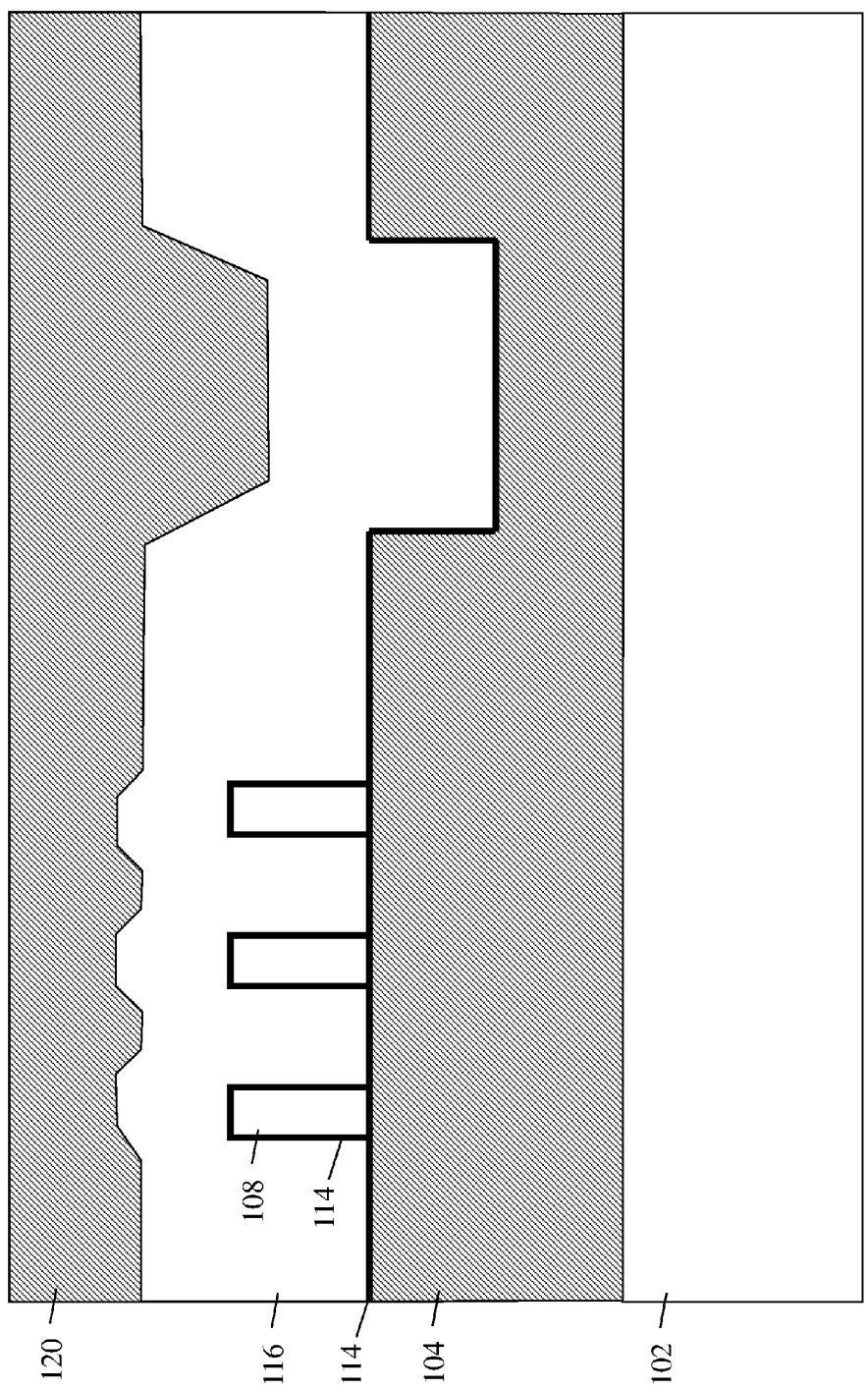
Figure 7:
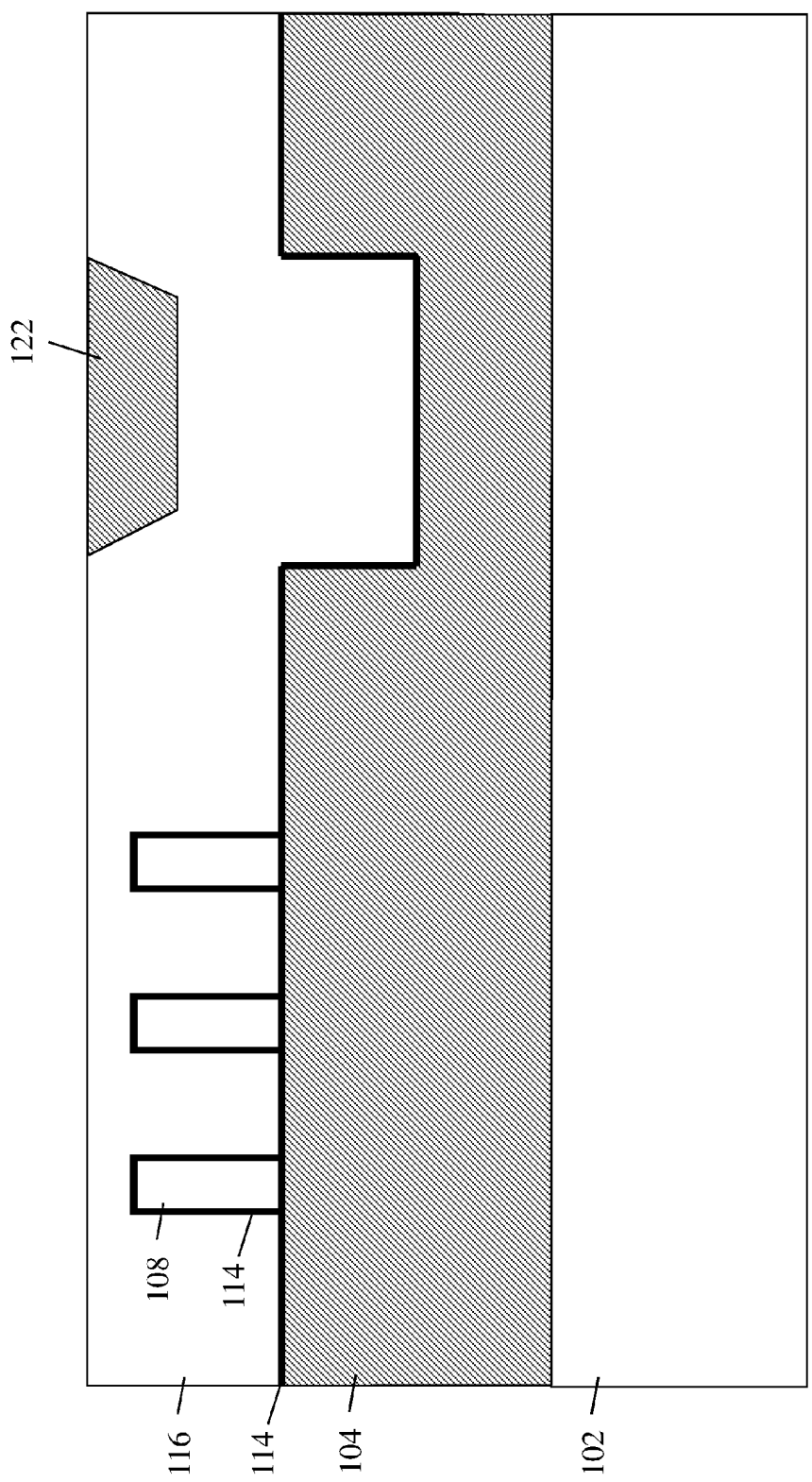

As then shown in FIG. 6, an oxide layer 120 (e.g., $SiO_2$) is blanket deposited over the topographic polysilicon layer 116 completely filling the depression 118. A chemical mechanical planarizing/polishing (CMP) operation is then used to remove most of the oxide layer 120 and planarize the dummy gate portion of the oxide layer 116. This is illustrated in FIG. 7, which also shows that a protective "oxide island" 122 remains over the portion of the polysilicon layer 116 formed in the recess of the BOX layer 104. The protective oxide island 122 ultimately protects the polysilicon resistor at a point in processing when removing dummy gate polysilicon material, as will be described in further detail.

Figure 8:
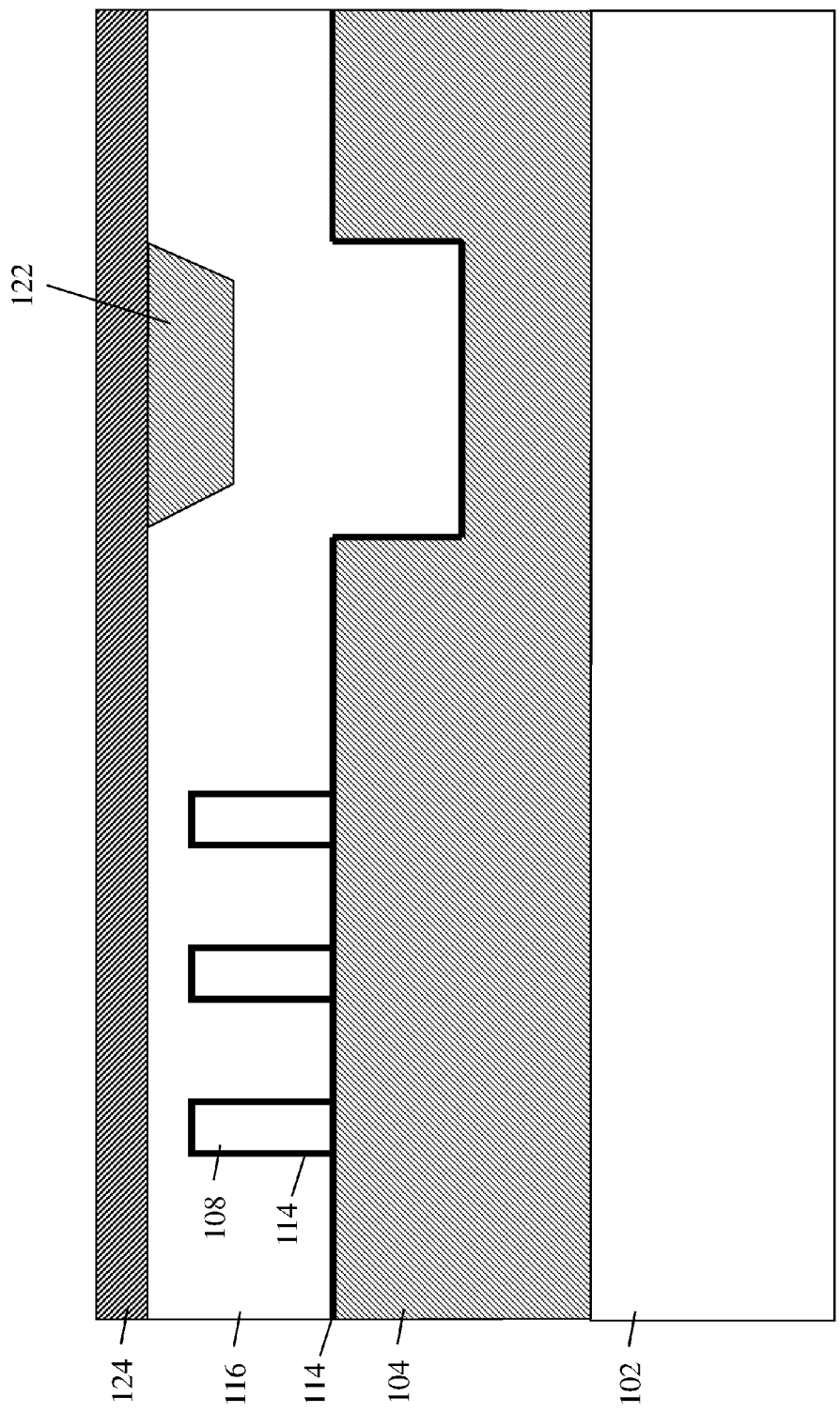
Figure 9:
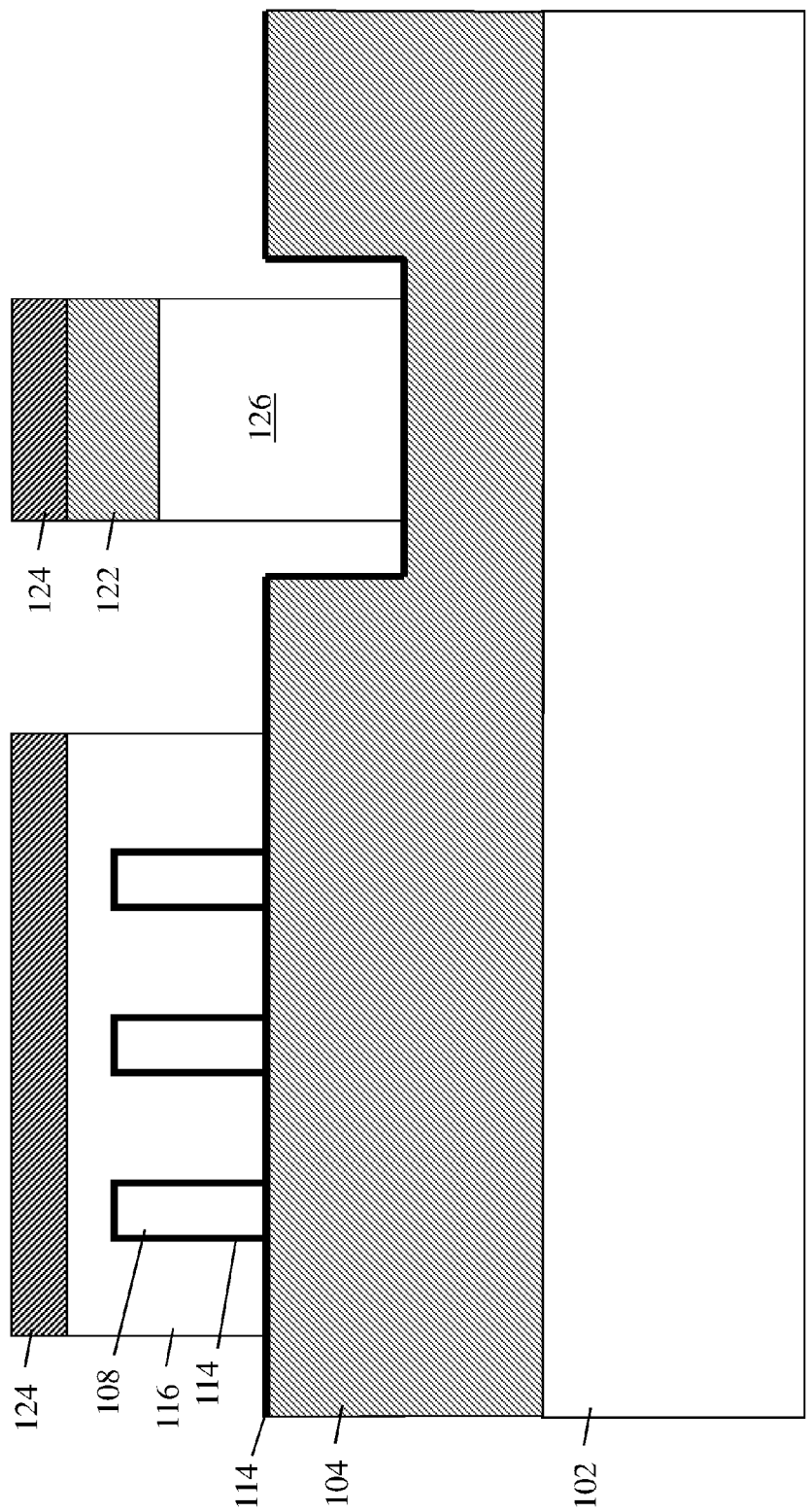

Referring to FIG. 8, a hardmask layer 124 is formed over the structure of FIG. 7, including planarized top surfaces of the polysilicon layer 116 and the protective oxide island 122. The hardmask layer 124 may include any suitable material, such as nitride layer for example, that has an etch selectivity with respect to oxide and polysilicon materials. As shown in FIG. 9, the hardmask layer 124 is patterned, followed by etching to remove portions of the polysilicon layer 116 not used for the dummy gate structure or for the polysilicon resistor 126. It will be noted that the protective oxide island 122 remains over the newly defined polysilicon resistor 126.

Figure 10:
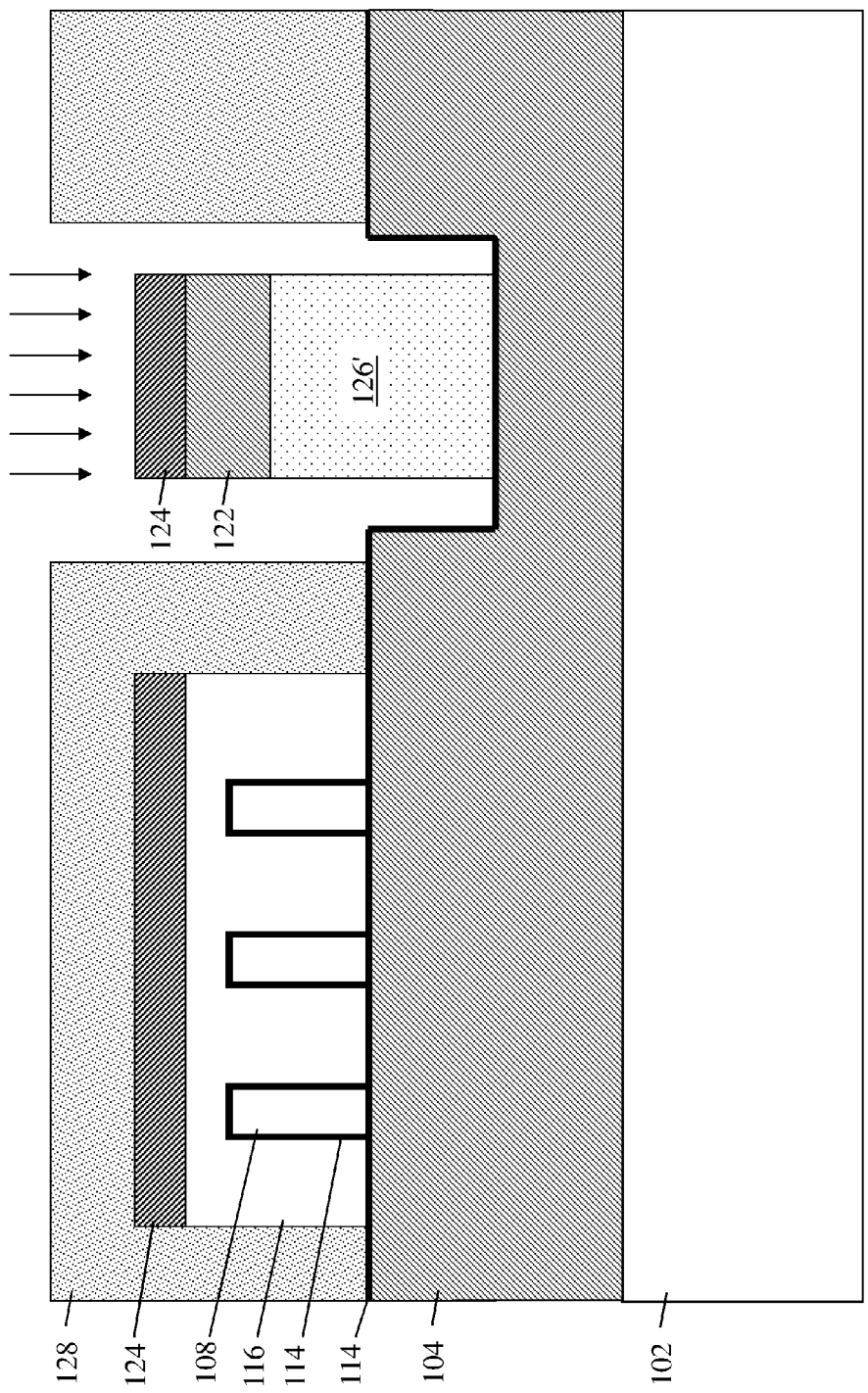

After the dummy gate and resistor definition in FIG. 9, FIG. 10 illustrates the formation and patterning of a resist layer 128 to expose the region including the polysilicon resistor 126. An ion implantation (e.g., boron), indicated by the arrows in FIG. 10, is used to dope the resistor (now designated by 126') to a desired conductivity. The desired conductivity of the doped resistor 126' depends on the concentration of the dopant atoms and implantation energy, among other aspects. In general, the implant conditions are selected so as place a majority of the dopant concentration roughly at a mid-region of the resistor 126'.

Figure 11:
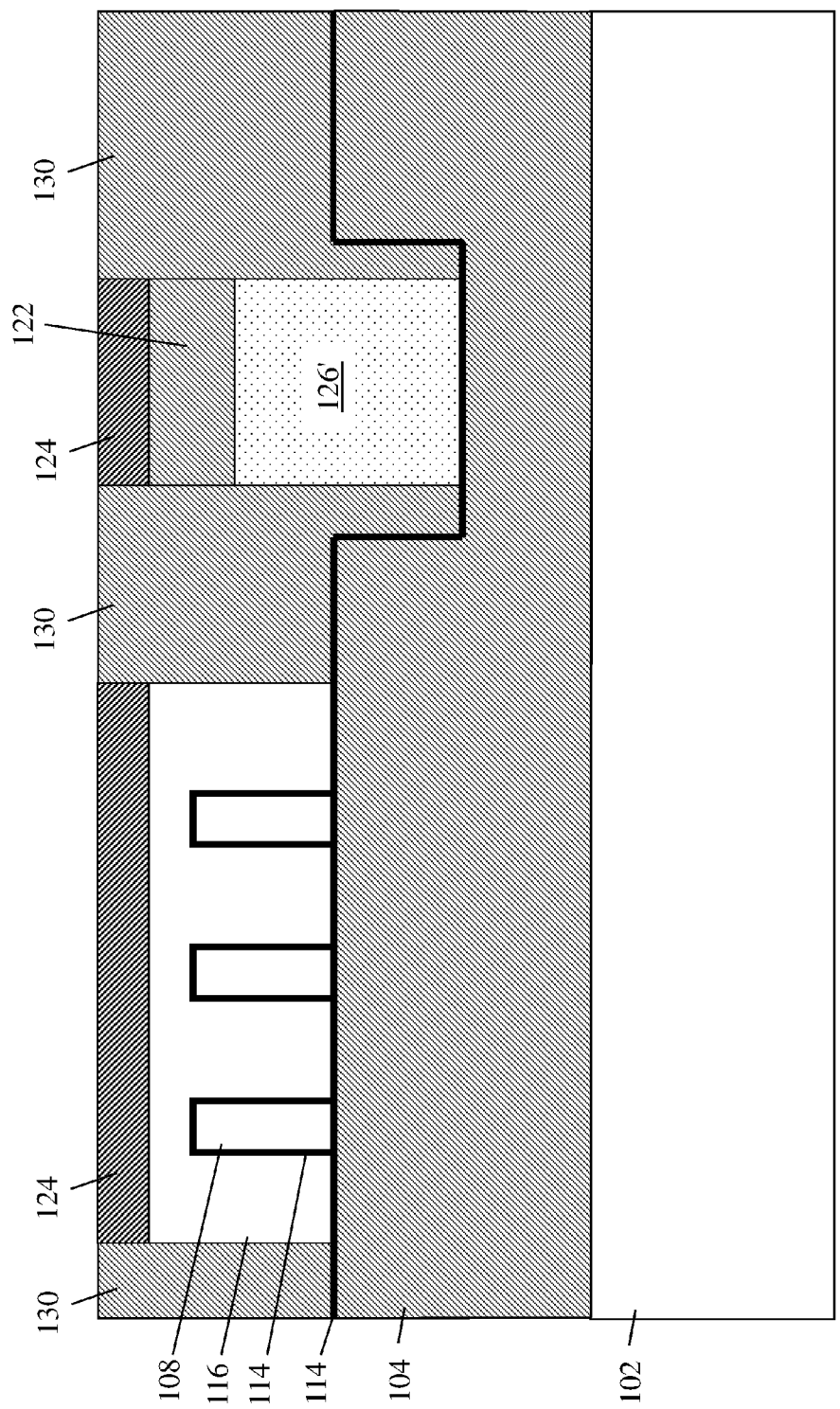
Figure 12:
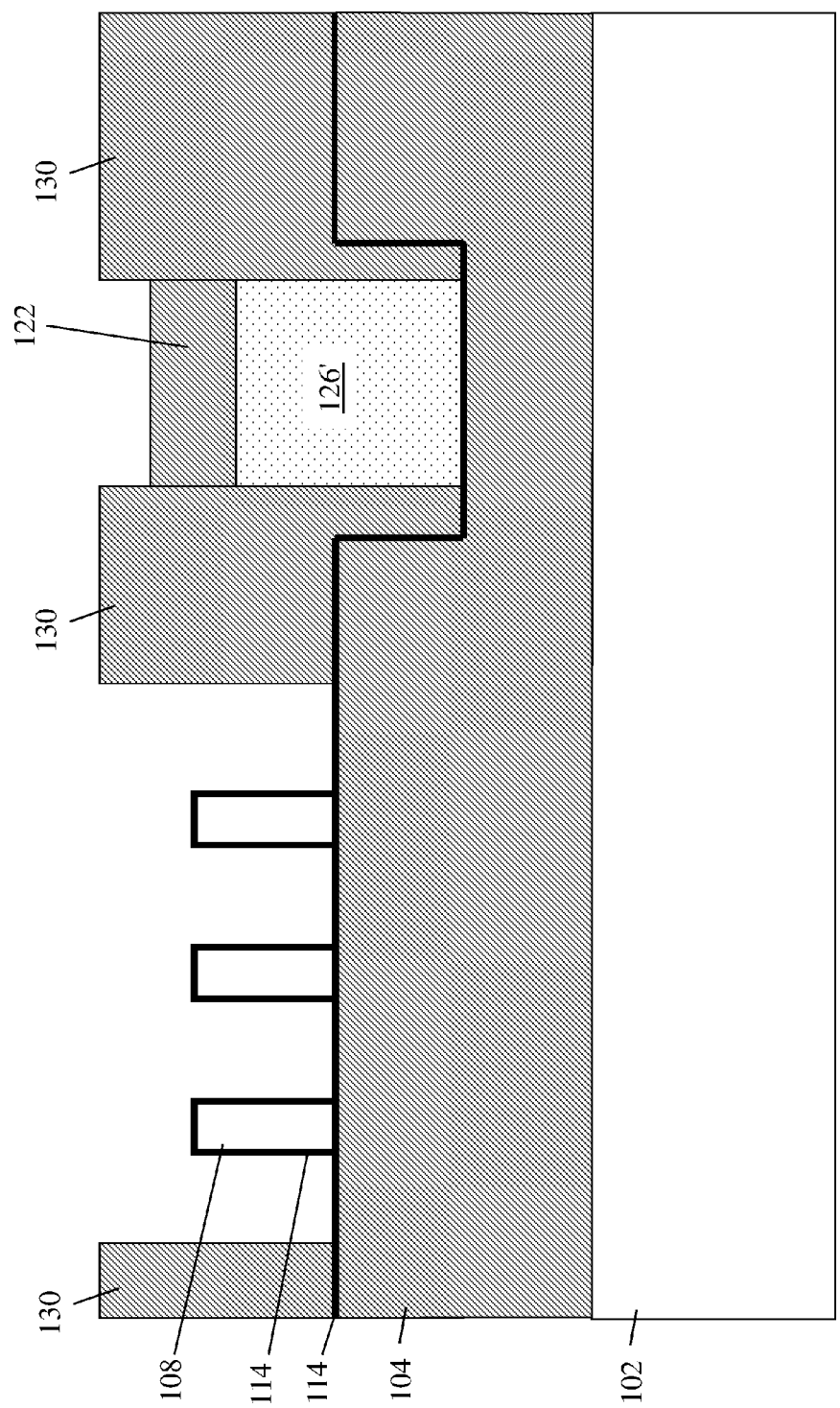

With the resistor 126' now doped to have the desired resistance value, the resist layer may then be removed. As then shown in FIG. 11, a high density plasma (HDP) oxide layer 130 is formed over the structure, and then planarized to expose remaining portions of the hardmask layer 124. The hardmask layer 124 is then selectively removed to expose the dummy gate polysilicon material 116 over the fins 108. Notably, the hardmask removal leaves the protective oxide island 126 substantially intact. In FIG. 12, an etch process to remove the dummy gate polysilicon material is performed, leaving the resistor 126' in place. The thin conformal oxide layer 114 may optionally be removed after the polysilicon removal, in preparation for the replacement gate stack formation. Alternatively, it may remain in place to act as an interfacial layer for a high-k gate dielectric layer.

Figure 13:
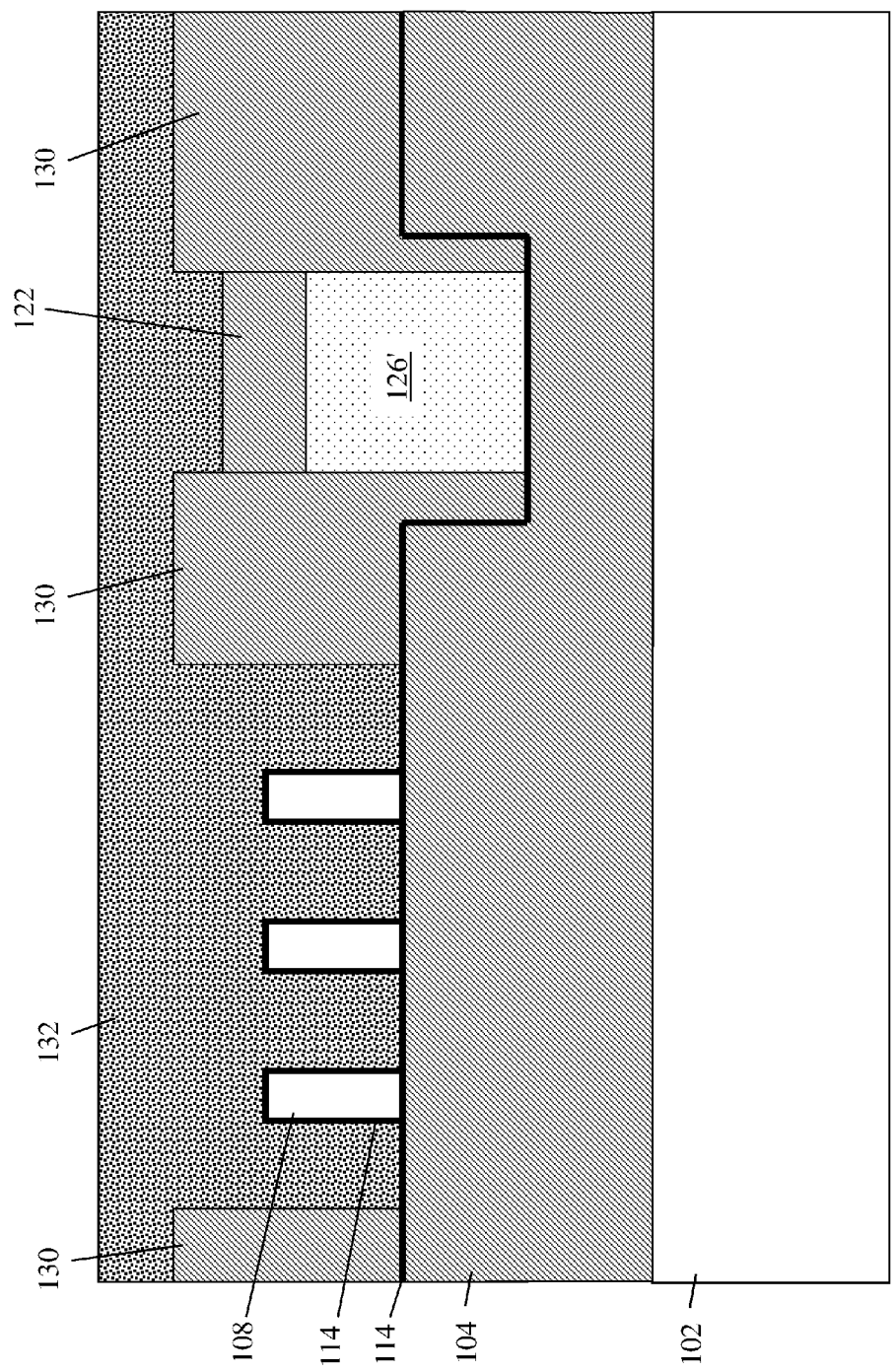
Figure 14:
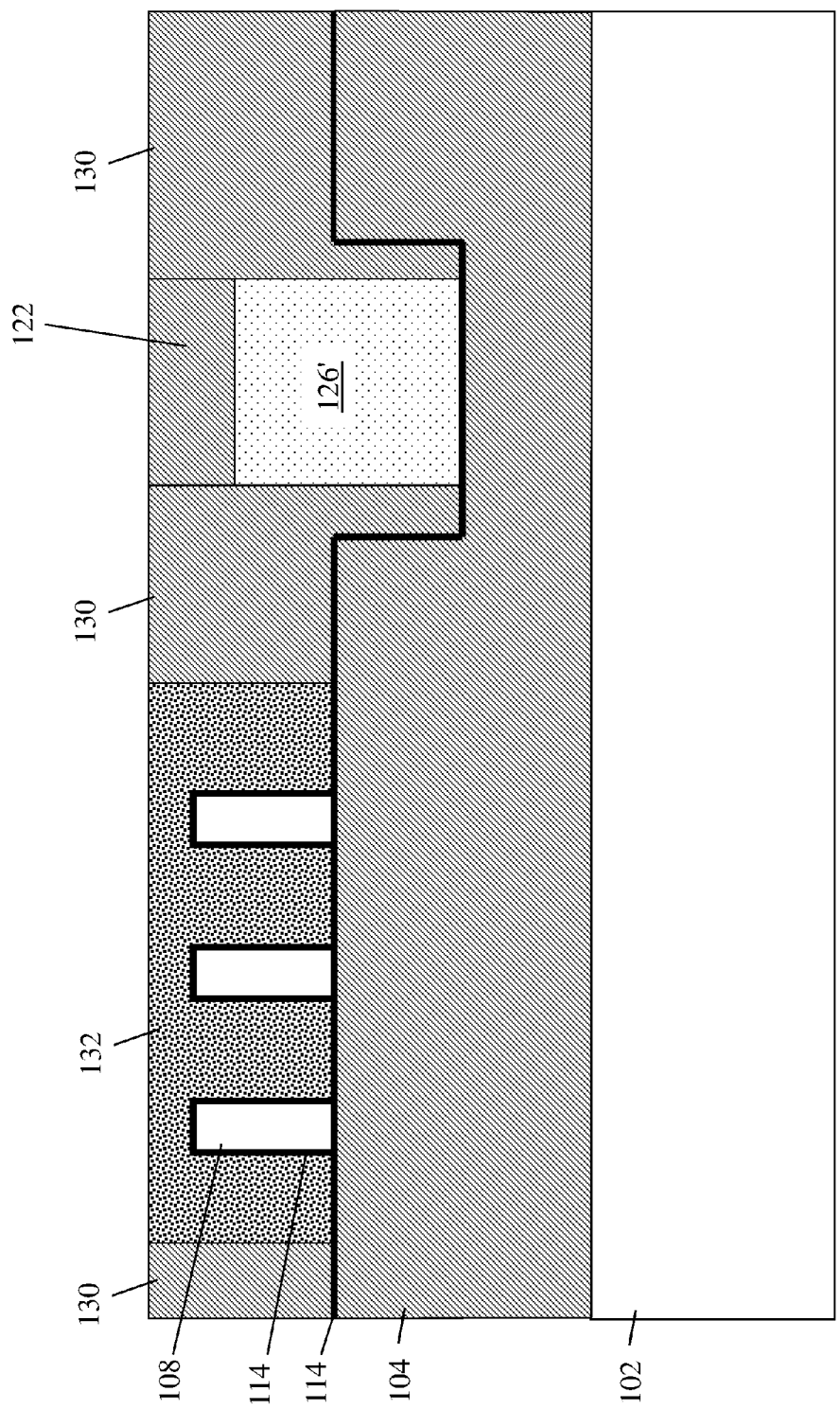

As then shown in FIG. 13, RMG processing as known in the art may continue, including the formation of high-k, workfunction and gate metal layers. For ease of illustration, the gate stack layers are generally indicated by 132 in FIG. 13, and it will be understood that the layers 132 may include several materials. Finally, as shown in FIG. 14, the gate stack material layers 132 are planarized to define a finFET area and a doped polysilicon resistor 126'. From this point, processing may continue as known in the art, including forming FET and resistor contact structures, and upper level wiring.

As will thus be appreciated, the topographic deposition of polysilicon material followed by oxide deposition allows for an aligned, protective oxide cap to cover resistor polysilicon material in a replacement gate process for SOI finFET devices such that dummy gate material removal does not affect the integrity of the resistor.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a polysilicon resistor in replacement metal gate (RMG) processing of finFET devices, the method comprising:
   forming a plurality of semiconductor fins over a buried oxide layer of a silicon-on-insulator substrate;
   forming a trench in the buried oxide layer;
   forming a conformal oxide layer having a thickness of about 2-4 nanometers on the semiconductor fins, the buried oxide layer, and the trench;
   forming a polysilicon layer having a thickness of about 30-100 nanometers over the semiconductor fins and in the trench, the polysilicon layer having a depression corresponding to a location of the trench;
   forming an oxide layer over the polysilicon layer;
   planarizing the oxide layer and the polysilicon layer so as to remove the oxide layer, except for a portion of the oxide layer formed in the depression, thereby defining a protective oxide island directly over a portion of the polysilicon layer corresponding to a location of the polysilicon resistor;
   forming a nitride hardmask over the polysilicon layer and the protective oxide island;
   patterning the hardmask and etching the polysilicon layer to define both a dummy gate structure over the fins and the polysilicon resistor;
   forming a patterned resist layer to protect the semiconductor fins;
   performing an ion implantation with boron to dope the polysilicon resistor;
   depositing a high density plasma (HDP) oxide layer and planarizing the HDP layer to expose the patterned hardmask layer;
   removing the patterned hardmask layer and etching the exposed polysilicon layer to remove the dummy gate structure, wherein the protective oxide island prevents the polysilicon resistor from being removed;
   removing the conformal oxide layer;
   forming one or more replacement metal gate stack layers over the fins; and
   planarizing the metal gate stack layers to define a finFET area and a doped polysilicon resistor.

* * * * *